US012787491B2

(12) United States Patent
Chaji et al.

(10) Patent No.: US 12,787,491 B2
(45) Date of Patent: Nov. 3, 2026

(54) MICRODEVICE BLOCK TRANSFER

(71) Applicant: VueReal Inc., Waterloo (CA)

(72) Inventors: Gholamreza Chaji, Waterloo (CA); Lauren Lesergent, Kitchener (CA)

(73) Assignee: VueReal Inc., Waterloo (CA)

( * ) Notice: Subject to any disclaimer, the term of this patent is extended or adjusted under 35 U.S.C. 154(b) by 644 days.

(21) Appl. No.: 18/040,522

(22) PCT Filed: Aug. 6, 2021

(86) PCT No.: PCT/CA2021/051092
§ 371 (c)(1),
(2) Date: Feb. 3, 2023

(87) PCT Pub. No.: WO2022/027139
PCT Pub. Date: Feb. 10, 2022

(65) Prior Publication Data

US 2023/0307575 A1 Sep. 28, 2023

Related U.S. Application Data

(60) Provisional application No. 63/062,057, filed on Aug. 6, 2020.

(51) Int. Cl.
*H10H 20/01* (2025.01)
*H10P 74/20* (2026.01)

(52) U.S. Cl.
CPC ........... *H10H 20/01* (2025.01); *H10P 74/203* (2026.01); *H10P 74/207* (2026.01)

(58) Field of Classification Search
CPC ..... H01L 22/12; H01L 22/14; H01L 21/6835; H10H 20/01; H10P 74/203; H10P 74/207
See application file for complete search history.

(56) References Cited

U.S. PATENT DOCUMENTS

| | | | |
|---|---|---|---|
| 5,981,302 | A | 11/1999 | Alswede et al. |
| 8,236,611 | B1 | 8/2012 | Anderson et al. |
| 8,518,204 | B2 | 8/2013 | Hu et al. |
| 9,490,276 | B2 | 11/2016 | Kim et al. |
| 2005/0158967 | A1 | 7/2005 | Huang et al. |
| 2006/0128064 | A1 | 6/2006 | Chen et al. |
| 2007/0070311 | A1 | 3/2007 | Bijnen et al. |

(Continued)

FOREIGN PATENT DOCUMENTS

| | | | |
|---|---|---|---|
| CN | 109075119 | A | 12/2018 |
| CN | 110957342 | A | 4/2020 |

(Continued)

OTHER PUBLICATIONS

ROC (Taiwan): TW Office Action relating to TW application No. 109105676, dated Apr. 4, 2024.

(Continued)

*Primary Examiner* — Jeff W Natalini
*Assistant Examiner* — Rose Keagy

(57) ABSTRACT

What is disclosed is structures and methods of integrating blocks of microdevices into the system backplane. Process is outlined for forming blocks of microdevices and forming of transfer templates to facilitate transfer of blocks of microdevices to the system backplane. Further, aspects deal with microdevices forming blocks from different wafers and substrates.

19 Claims, 9 Drawing Sheets

(56) References Cited

U.S. PATENT DOCUMENTS

| | | | |
|---|---|---|---|
| 2010/0013033 | A1 | 1/2010 | Chou et al. |
| 2013/0130440 | A1 | 5/2013 | Hu et al. |
| 2014/0106474 | A1 | 4/2014 | Chen et al. |
| 2014/0340900 | A1 | 11/2014 | Bathurst et al. |
| 2018/0006083 | A1 | 1/2018 | Zhu et al. |
| 2018/0151804 | A1 | 5/2018 | Chaji et al. |
| 2019/0080970 | A1 | 3/2019 | Chaji |
| 2019/0088481 | A1* | 3/2019 | Budd ...................... H01L 24/81 |
| 2019/0096744 | A1 | 3/2019 | Chaji et al. |
| 2019/0096774 | A1* | 3/2019 | Chaji ...................... H01L 22/20 |
| 2019/0189469 | A1* | 6/2019 | Andry ............... H01L 21/67092 |
| 2020/0013662 | A1* | 1/2020 | Chaji .................. H01L 21/6835 |
| 2020/0043902 | A1 | 2/2020 | Ge et al. |
| 2021/0202572 | A1 | 7/2021 | Chaji et al. |

FOREIGN PATENT DOCUMENTS

| | | | |
|---|---|---|---|
| CN | 111129235 | A | 4/2020 |
| CN | 111128789 | A | 5/2020 |
| KR | 20190097062 | A | 8/2019 |
| KR | 20200034931 | A | 4/2020 |
| TW | 201705532 | A | 2/2017 |
| TW | 202105671 | A | 2/2021 |
| WO | 2018096455 | A1 | 5/2018 |
| WO | 2018170352 | A1 | 9/2018 |

OTHER PUBLICATIONS

KIPO: KR Office Action relating to KR application No. 10-2021-7030214, dated Sep. 29, 2024.

ROC (Taiwan): TW Office Action relating to TW application No. 110129061, dated Apr. 8, 2025.

WIPO: PCT International Search Report and Written Opinion relating to PCT application No. PCT/CA2021/051092, dated Nov. 18, 2021.

CNIPA: CN Office Action relating to CN application No. 202080015087.3, dated Feb. 22, 2025.

KIPO: KR Office Action relating to KR application No. 10-2023-7004486, dated May 14, 2025.

ROC (Taiwan): TW Office Action relating to TW application No. 111136959, dated Dec. 24, 2025.

KIPO: KR Office Action relating to KR application No. 10-2021-7030214, dated Aug. 28, 2025.

KIPO: KR Office Action relating to KR application No. 10-2023-7004486, dated Jan. 13, 2026.

Intellectual Property India: Office Action relating to IN application No. 202247076113 dated May 20, 2026.

* cited by examiner

MICRODEVICE BLOCK TRANSFER

FIELD OF THE INVENTION

The present disclosure relates to the integration of micro devices into system substrate.

BRIEF SUMMARY

The invention relates to a method to transfer microdevices to a system backplane, the method comprising, embedding microdevices in a housing structure with a buffer layer, bonding the housing structure to a temporary substrate with a bonding layer, having a release layer between the housing structure and the temporary substrate, singulating the housing structure around a set of microdevices forming blocks of microdevices, and using the blocks of microdevices to form a transfer template for transferring the microdevices into the system backplane.

BRIEF DESCRIPTION OF THE DRAWINGS

The foregoing and other advantages of the disclosure will become apparent upon reading the following detailed description and upon reference to the drawings.

DETAILED DESCRIPTION

In this description, the term “device” and “microdevice” are used interchangeably. However, it is clear to one skilled in the art that the embodiments described here are independent of the device size.

A few embodiments of this description are related to integration microdevices into a receiving substrate. The system substrate may comprise micro light emitting diodes (LEDs), Organic LEDs, sensors, solid state devices, integrated circuits, (micro-electro-mechanical systems) MEMS, and/or other electronic components.

The receiving substrate may be, but is not limited to, a printed circuit board (PCB), thin film transistor backplane, integrated circuit substrate, or, in one case of optical microdevices such as LEDs, a component of a display, for example a driving circuitry backplane. The patterning of microdevice donor substrate and receiving substrate can be used in combination with different transfer technology including but not limited to pick and place with different mechanisms (e.g. electrostatic transfer head, elastomer transfer head), or direct transfer mechanism such as dual function pads and more).

Various embodiments in accordance with the present structures and processes provided are described below in detail.

Figure 1A:
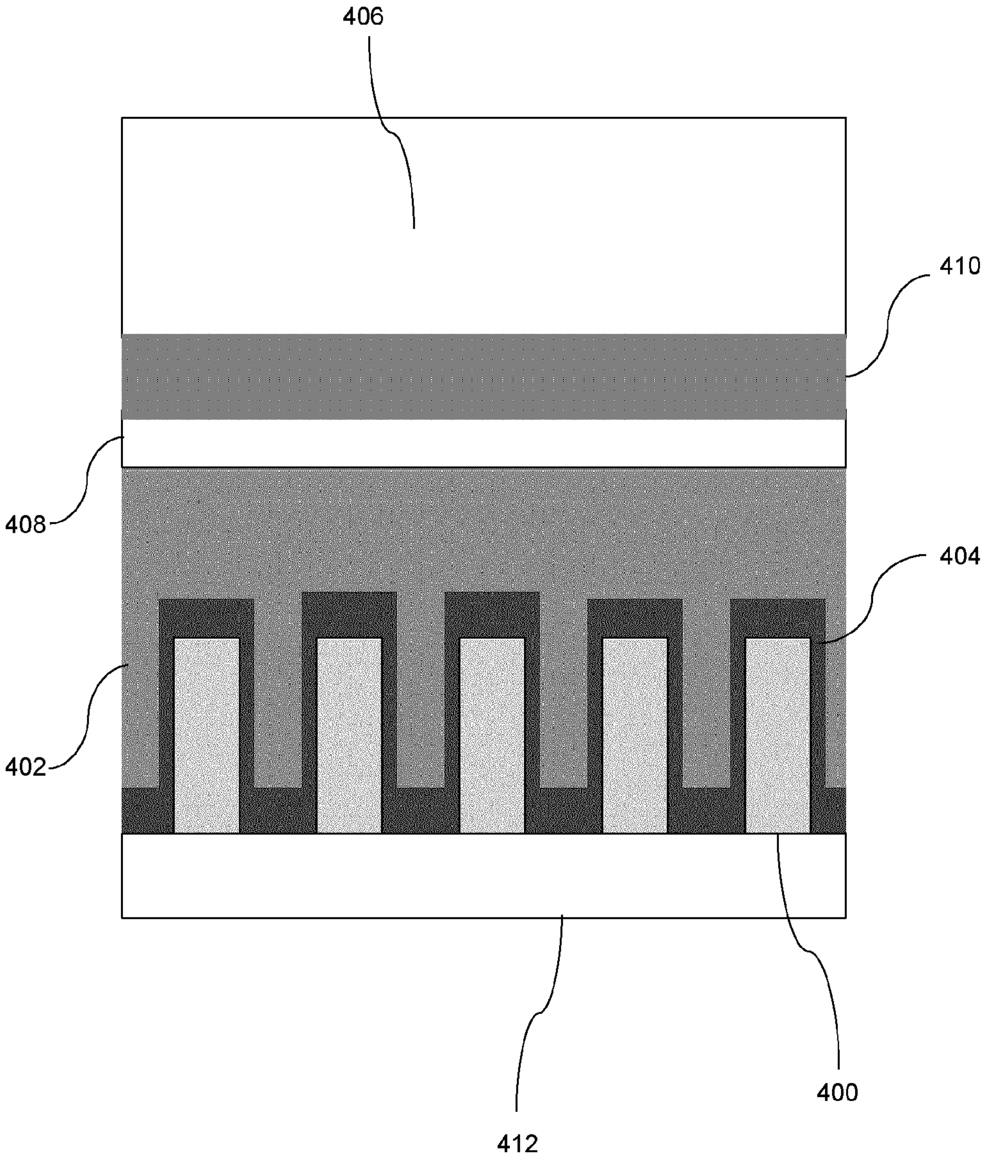
FIG. 1A shows an exemplary microdevice embedded in a housing structure and release layer.

FIG. 1A shows an example of the microdevices 400 embedded in a housing structure 402 with a buffer layer 404. The structure is bonded to a temporary substrate 406 with a bonding layer 408. The bonding layer can be the same as the housing layer. There can be a release layer 410 between the housing structure and the temporary substrate 406. The bonding layer 408 can be the same as the release layer 410. There can be other layers on microdevice 400 such as bonding, pads, anchor and so on. These layers are demonstrated as layer 412.

Figure 1B:
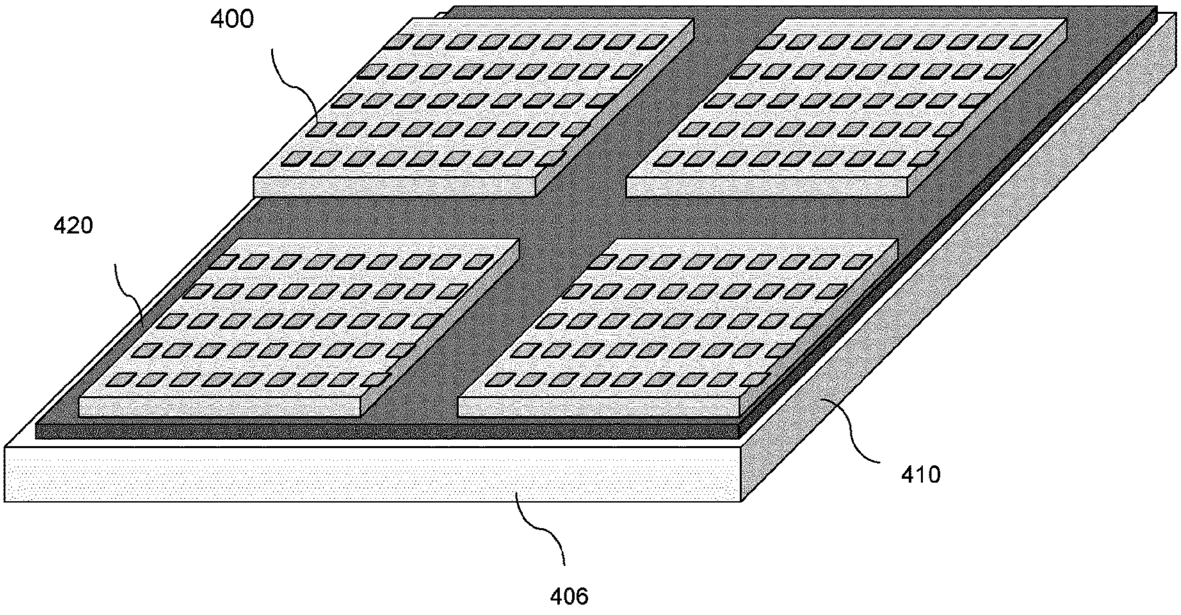
FIG. 1B shows an exemplary embodiment of microdevices confined in a block layer set on a release layer on top of a substrate.

FIG. 1B shows an embodiment where the microdevices 400 are confined in blocks 420. These blocks 420 could be developed by singulating the housing layer(s) around a set of microdevices. Here, the release layer 410 can be patterned or be continuous. The housing materials can be different types of polymers (e.g. polyamide, BCB, SU8) or other dielectric.

Figure 2:
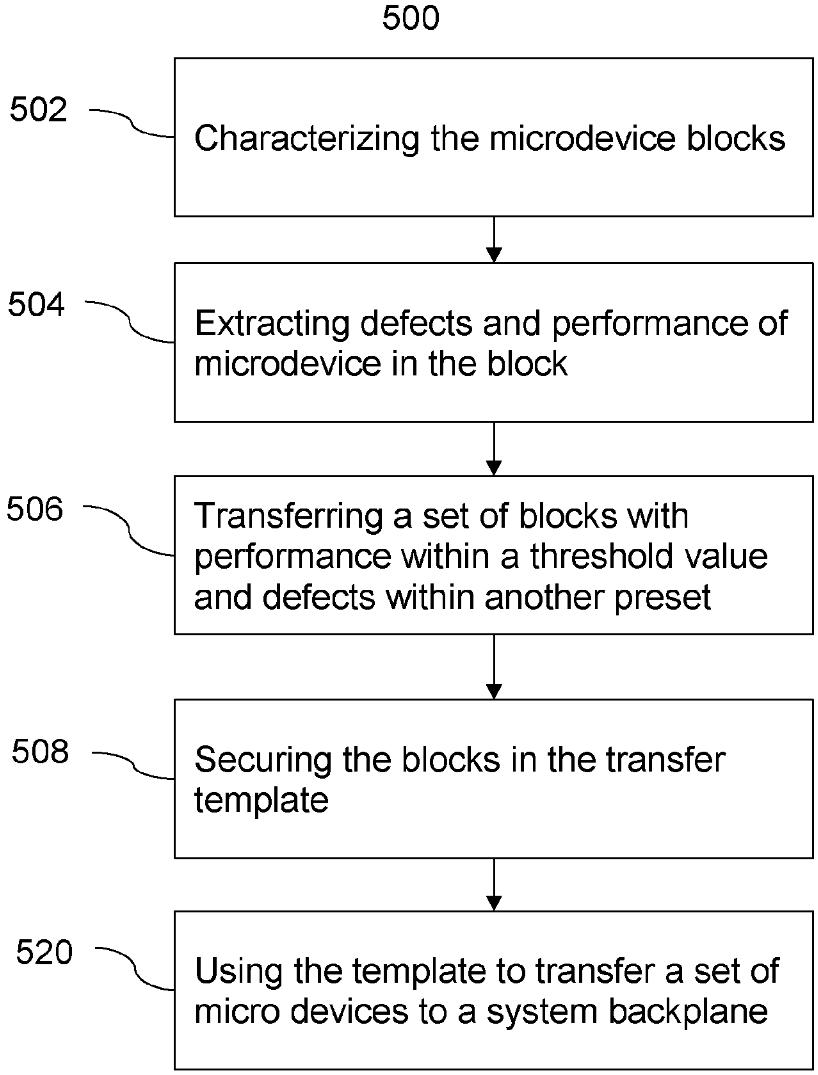
FIG. 2 shows a process of using the blocked microdevices to form a template for transferring microdevices into a system backplane.

FIG. 2 shows a process 500 of using the blocked microdevices to form a template for transferring microdevices into a system backplane. During the first step 502, the microdevices in a block are characterized for at least one parameter. This characterization can be done through visual inspection, photo luminance, or electrical measurements. The extracted parameter can be either electrical, optical, physical or other types. The blocks can be mapped based on the extracted parameter. A set of blocks can be selected and transferred to a transfer template. The selection can be done based on the performance or defects in the blocks 506. Here the set of blocks are chosen if the defected microdevices in the block is smaller than a set threshold or the performance of the microdevices in that block is within a set threshold as well as part of step 504. Also the performance difference between the blocks is within threshold values. The transfer of the blocks to the transfer template can be done by different processes such as pick and place, laser ablation, or offset printing. In one case, pick and place can be used. During the pickup process, the release layer is activated so that the block can be separated from the temporary substrate. Then the block is moved to the transfer template and placed on the template. The placing process can include bonding as well. The bonding step can be adhesive. After the set of blocks are transferred to the transfer template, the blocks can be secured in place 508. The process of securing can include curing, planarization, filler or other process steps. In case of laser ablation, there can be a layer under each block that expands significantly under emission of a certain laser and pushing the block into the template.

The transfer template can be used to transfer microdevices into a system backplane 520. In one approach the microdevices are directly transferred from the template into the system backplane. Here the transfer template gets aligned with a part of the backplane. Then the selected set of microdevices in the template are placed on the backplane. The placement can be either by bonding, or laser separation. In another case, the microdevices are picked from the template and then transferred in the system backplane.

Figure 3:
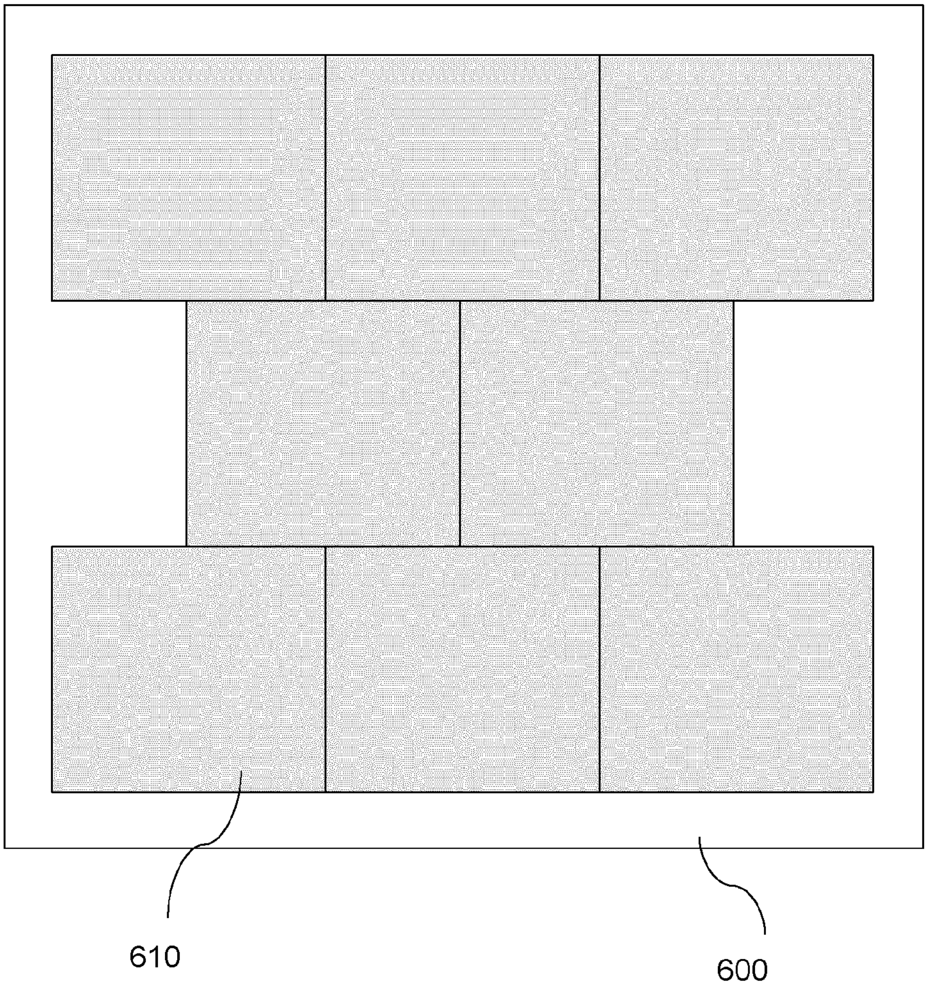
FIG. 3 shows one exemplary placement of blocks 610 in a transfer template.

FIG. 3 shows one exemplary placement of blocks 610 in a transfer template 600. The skew in the blocks can be different or fixed. The skew can reduce some visual artifacts caused by the sharp edges. The templates also can have indentation in the edges. And the edges between the templates fit to the edge of the adjacent template.

Figure 4:
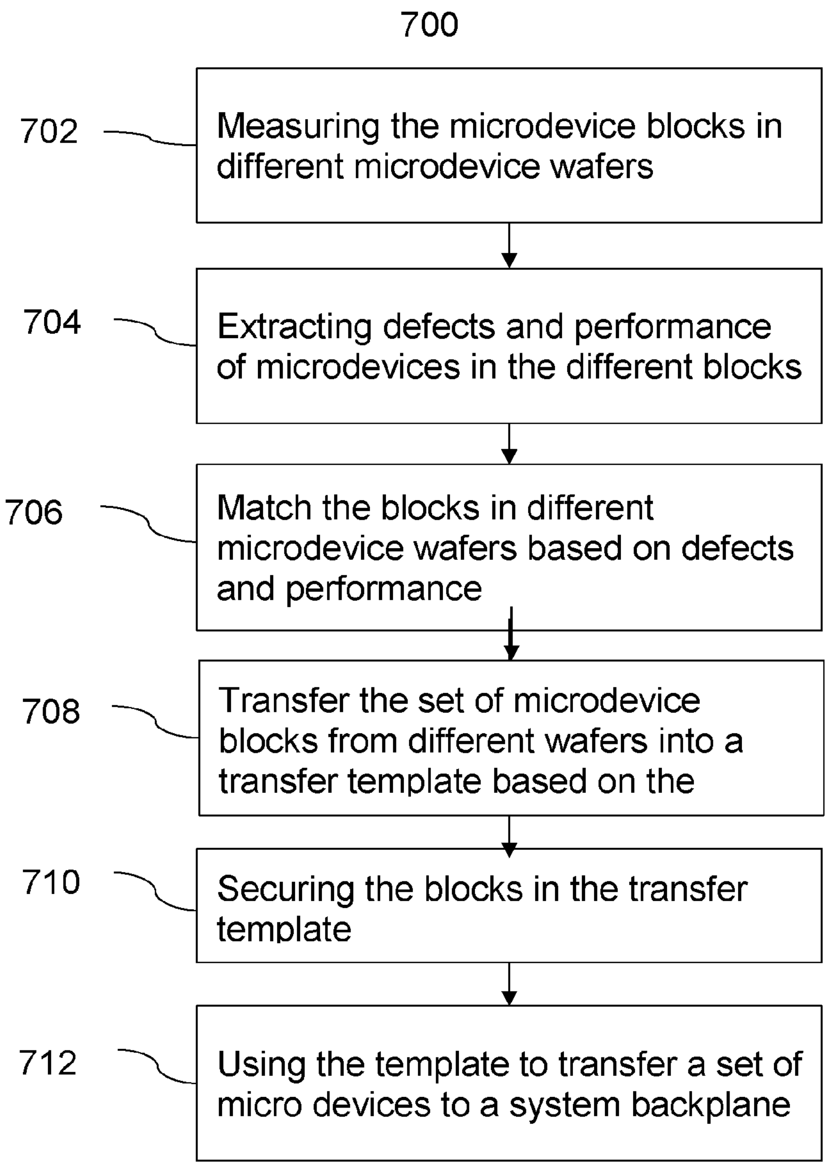
FIG. 4 shows process steps for forming a multi-device template from different wafers.

FIG. 4 shows a process steps 700 for forming a multi-device template using the blocked microdevices from different wafers to form a transfer template for transferring microdevices into a system backplane. During the first step 702 and 704, the block of microdevices in different wafers are characterized for at least one parameter. This characterization can be done through visual inspection, photo luminance, or electrical measurements. The extracted parameter can be either electrical, optical, physical, or other types. The blocks can be mapped based on the extracted parameters. A set of blocks from different wafers can be selected and transferred to a transfer template. The selection can be done based on the performance or defects in the blocks 706. Here the set of blocks are chosen if the defected microdevices in the block is smaller than a set threshold or the performance of the microdevices in that block is within a set threshold as well. Also the performance difference between the blocks is within threshold values. The transfer of the blocks to the template can be done by different processes. In one case, pick and place can be used. During the pickup process, the release layer is activated so that the block can be separated from the temporary substrate. Then the block is moved to the transfer template and placed on the template. The placing process can include bonding as well. The bonding step can be adhesive. After the set of blocks are transferred to the transfer template, the blocks can be secured in place 708. The process of securing can include curing, planarization, filler, or other process steps.

The template can be used to transfer microdevices into a system backplane 720. In one approach the microdevices are directly transferred from the template into the system backplane. Here the template gets aligned with a part of the system backplane. Then the selected set of microdevices in the template are placed on the backplane. The placement can be either by bonding, or laser separation. In another case, the microdevices are picked from the template and then transferred in the system backplane.

Figure 5A:
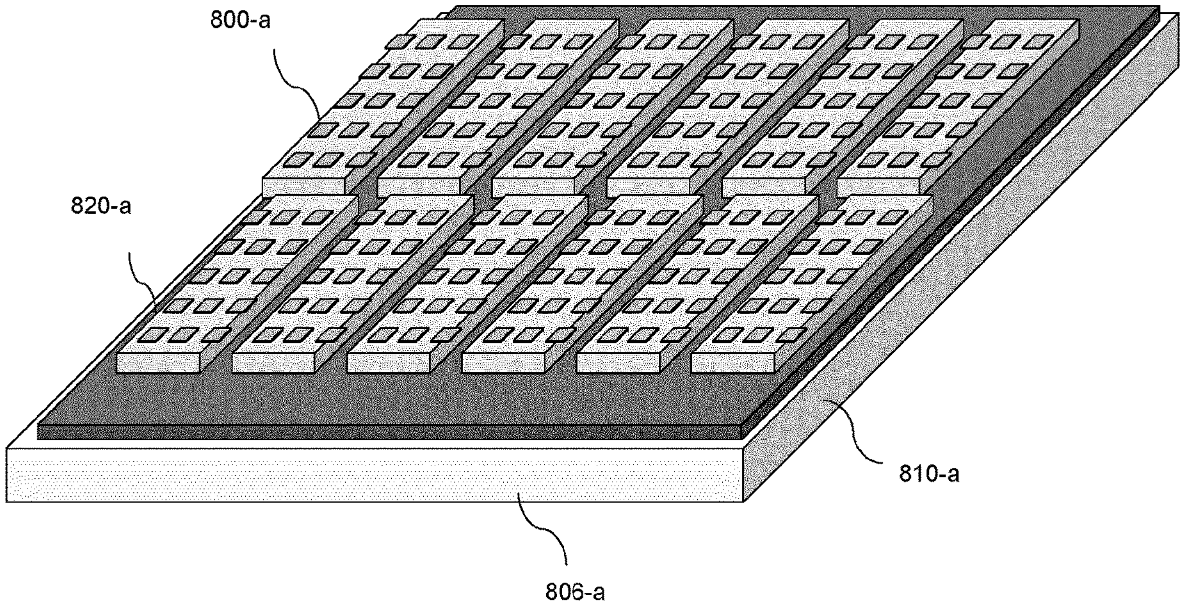
FIGS. 5(*a*)-5(*e*) show transfer process of blocks with different microdevices from different substrates While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.
Figure 5B:
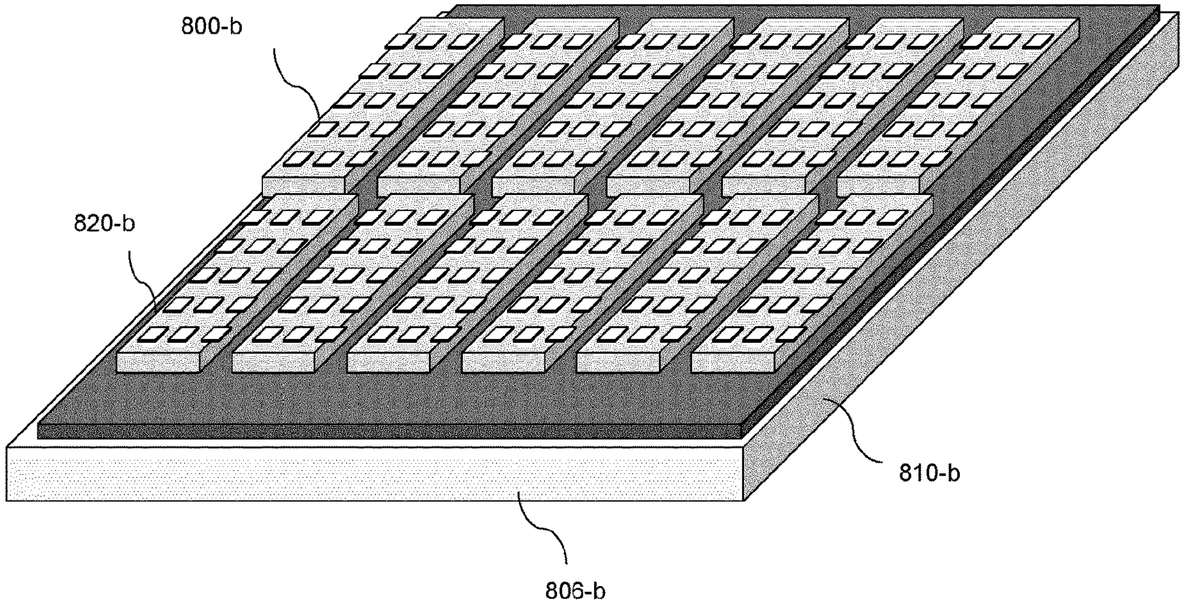
Figure 5:
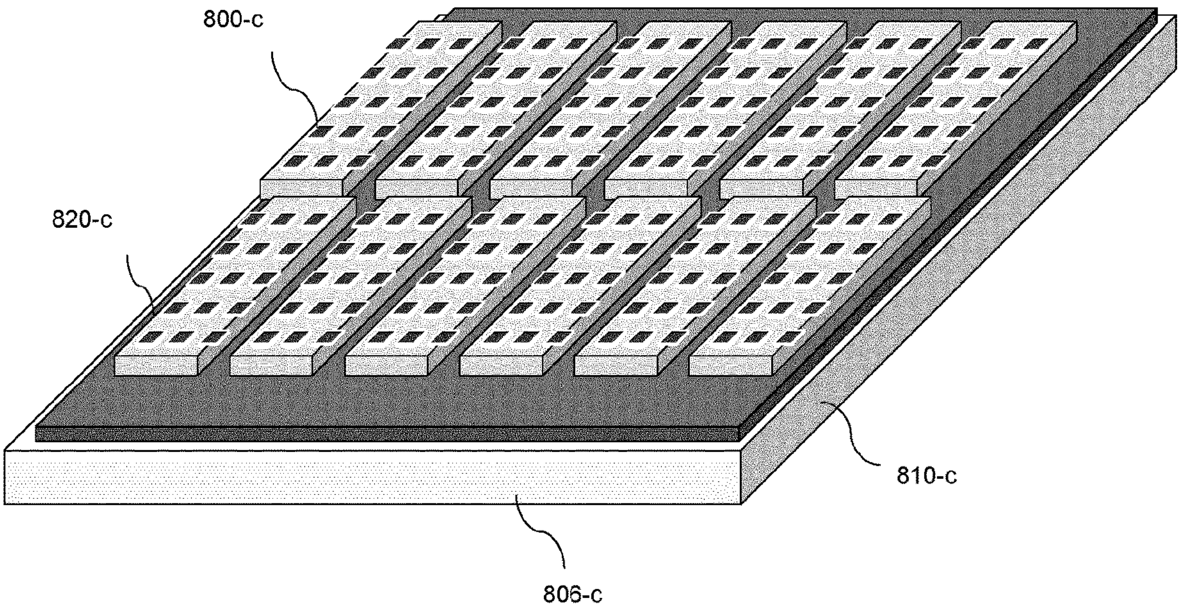
Figure 5D:
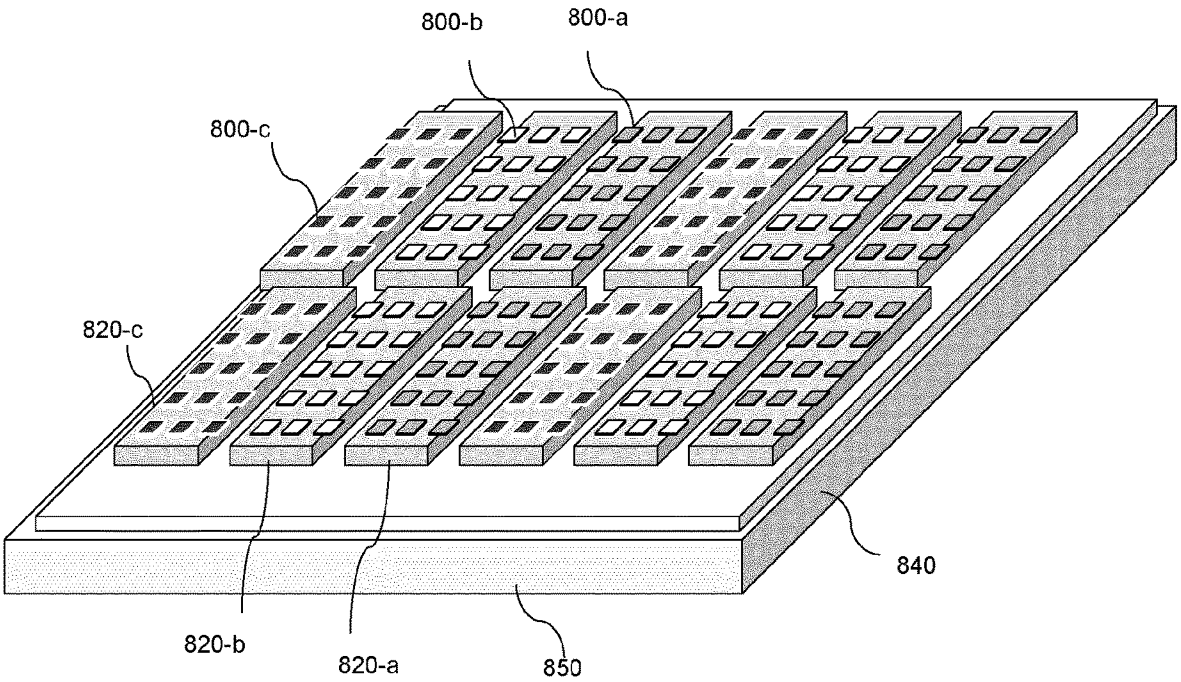
Figure 5:
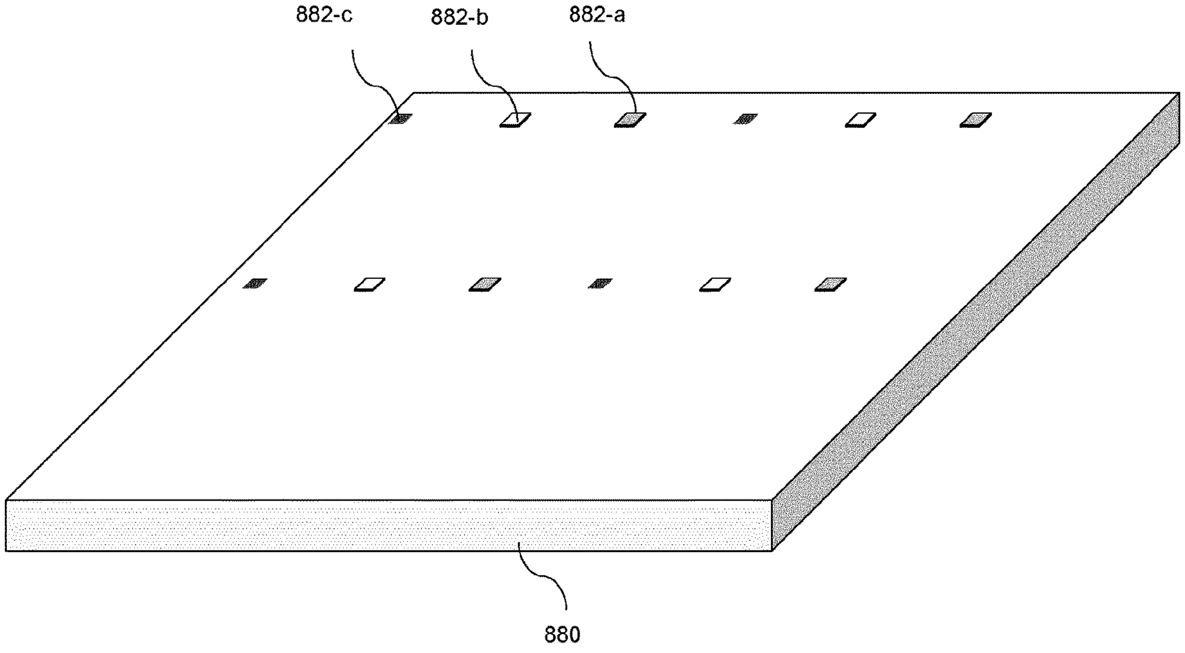

FIGS. 5(*a*)-(*e*) show different microdevices 800-*a*, 800-*b*, and 800-*c* from different substrates 806-*a*, 806-*b* and 806-*c*. The microdevices are embedded in blocks 820-*a*, 820-*b* and 820-*c*. A release layer 810-*a*, 810-*b*, and 810-*c* is used that can separate the microdevice blocks from the substrate. The release layers 810-*a*, 810-*b*, and 810-*c* can be patterned or cover the entire surface of the transfer template. The pattern can be the same as the block pattern. After mapping the microdevices, at least one block from each substrate 806-*a*, 806-*b*, and 806-*c* are transferred to the transfer template 850. There is a bonding layer 840 to hold the block on the transfer template. The template can be patterned to match the position of each block, or it covers the entire transfer template. The blocks on the transfer template are placed to be in positions so it can correspond to the device positions 882-*a*, 882-*b*,and 882-*c* on system substrate 880.

Method Aspects

The present invention describes a method to transfer microdevices to a system backplane, the method comprising, embedding microdevices in a housing structure with a buffer layer, bonding the housing structure to a temporary substrate with a bonding layer, having a release layer between the housing structure and the temporary substrate, singulating the housing structure around a set of microdevices forming blocks of microdevices; and using the blocks of microdevices to form a transfer template for transferring the microdevices into the system backplane. The method further comprises, wherein the microdevices in a block are characterized for at least one parameter and wherein the characterization is done through a visual inspection, photo luminance, or electrical measurements. Here an extracted parameter is either an electrical, an optical or a physical type and wherein the blocks of microdevices are mapped based on the extracted parameter.

The method further comprises a set of blocks of microdevices is selected and transferred to the transfer template wherein the selection is based on a performance or defects in the blocks of microdevices and wherein the sets of blocks of microdevices are chosen if defected microdevices in the block is smaller than a set threshold or the performance of the microdevices in that block is within the set threshold. Further, a performance difference between the blocks of microdevices is within threshold values. In the method, transfer of the blocks of microdevices to the transfer template is done by a pick and place process, a laser ablation, or an offset printing and wherein during the pick and place process the release layer is activated for the block of microdevices to be separated from the temporary substrate. Here, in case of the laser ablation, there is a layer under each microdevice block that expands under an emission of a certain laser and pushing the microdevice block into the template. Further, the block is moved to the transfer template and placed on the transfer template and wherein placement on the block process includes bonding which is adhesive. Here the transferred set of blocks of microdevices to the transfer template are secured in place by a process of securing. Further, the process of securing includes curing, planarization, filler or covering with different layers. Here the microdevices are picked from the transfer template and then transferred in the system backplane and wherein the microdevices are picked from the transfer template and then transferred in the system backplane.

The method also comprises the case wherein the bonding layer is the same as the release layer. Further, there are additional layers on the microdevices such as bonding layers, pads, and anchors. Also, the microdevices are directly transferred from the transfer template into the system backplane where the transfer template gets aligned with a part of the system backplane and a selected set of blocks of microdevices in the transfer template are placed on the system backplane by a placement process and wherein the placement process is either by a bonding, or a laser separation.

The method also comprises for the case wherein the microdevices are from different wafers and wherein the block of microdevices in different wafers are characterized for at least one parameter.

The method also comprises the case wherein the microdevices from different substrates are embedded in separate microdevice blocks. Here release layers are used to the microdevice blocks from the substrates and wherein release layers are patterned or cover an entire surface of the transfer template.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

We claim:

1. A method to transfer microdevices to a system backplane, the method comprising:

embedding microdevices in a buffer layer in a housing structure, wherein the buffer layer is a single, continuous layer completely enclosing all of the microdevices, and wherein the housing structure is single, continuous structure adjacent to the buffer layer and encompassing all of the microdevices;

bonding the housing structure to a temporary substrate with a bonding layer;

having a release layer between the housing structure and the temporary substrate;

singulating the housing structure around a set of microdevices forming blocks of microdevices; and using the blocks of microdevices to form a transfer template for transferring the microdevices into the system backplane, wherein using the blocks of microdevices to form the transfer template includes selecting and transferring a set of the blocks of microdevices based on performance or defects in the blocks of microdevices.

2. The method of claim 1, wherein the microdevices in a block are characterized for at least one parameter.

3. The method of claim 2, wherein the characterization is done through a visual inspection, photo luminance, or electrical measurements.

4. The method of claim 2, wherein an extracted parameter is either an electrical, an optical or a physical type.

5. The method of claim 4, wherein the blocks of microdevices are mapped based on the extracted parameter.

6. The method of claim 1, wherein the sets of blocks of microdevices are chosen if defected microdevices in the block is smaller than a set threshold or the performance of the microdevices in that block is within the set threshold.

7. The method of claim 6, wherein a performance difference between the blocks of microdevices is within threshold values.

8. The method of claim 1, wherein transfer of the blocks of microdevices to the transfer template is done by a pick and place process, a laser ablation, or an offset printing.

9. The method of claim 8, wherein during the pick and place process the release layer is activated for the block of microdevices to be separated from the temporary substrate.

10. The method of claim 9, wherein the block is moved to the transfer template and placed on the transfer template.

11. The method of claim 10, wherein placement on the block process includes bonding which is adhesive.

12. The method of claim 10, wherein the transferred set of blocks of microdevices to the transfer template are secured in place by a process of securing.

13. The method of claim 12, wherein the process of securing includes curing, planarization, filler or covering with different layers.

14. The method of claim 12, wherein the microdevices are directly transferred from the transfer template into the system backplane where the transfer template gets aligned with a part of the system backplane and a selected set of blocks of microdevices in the transfer template are placed on the system backplane by a placement process.

15. The method of claim 14, wherein the placement process is either by a bonding, or a laser separation.

16. The method of claim 12 wherein the microdevices are picked from the transfer template and then transferred in the system backplane.

17. The method of claim 8, where in case of the laser ablation, there is a layer under each microdevice block that expands under an emission of a certain laser and pushing the microdevice block into the template.

18. The method of claim 1, wherein the bonding layer is the same as the release layer.

19. The method of claim 1, wherein there are additional layers on the microdevices such as bonding layers, pads, and anchors.

* * * * *